(12) United States Patent
Sato

(10) Patent No.: US 10,601,403 B1
(45) Date of Patent: Mar. 24, 2020

(54) SUPER SCALE CAPACITOR FOR INTEGRATED CIRCUIT

(71) Applicant: RENESASA ELECTRONICS AMERICA INC., Milpitas, CA (US)

(72) Inventor: Tetsuo Sato, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 15/976,735

(22) Filed: May 10, 2018

Related U.S. Application Data

(60) Provisional application No. 62/510,558, filed on May 24, 2017.

(51) Int. Cl.
*H03H 11/40* (2006.01)
*H03H 11/48* (2006.01)
*H03F 3/45* (2006.01)

(52) U.S. Cl.
CPC ....... *H03H 11/483* (2013.01); *H03F 3/45659* (2013.01); *H03H 11/405* (2013.01)

(58) Field of Classification Search
CPC .............. H03H 11/405; H03H 11/483; H02M 3/15802; H03F 2200/456
See application file for complete search history.

(56) References Cited

U.S. PATENT DOCUMENTS

| | | | |
|---|---|---|---|
| 6,787,904 B2 | 9/2004 | Koyama et al. | |
| 7,466,116 B2 | 12/2008 | Sato et al. | |
| 7,642,498 B2* | 1/2010 | Zadeh | H03H 11/483 250/208.1 |
| 7,898,233 B2 | 3/2011 | Sato et al. | |
| 8,314,606 B2 | 11/2012 | Sato et al. | |
| 8,638,067 B2 | 1/2014 | Sato et al. | |
| 8,786,237 B2 | 7/2014 | Sato et al. | |
| 8,901,894 B2 | 12/2014 | Sato et al. | |
| 9,570,985 B2 | 2/2017 | Sato et al. | |
| 9,667,083 B2 | 5/2017 | Sato et al. | |
| 9,711,984 B2 | 7/2017 | Yoshida et al. | |
| 9,843,206 B2 | 12/2017 | Sato et al. | |
| 9,866,126 B2 | 1/2018 | Sato | |
| 2005/0099221 A1* | 5/2005 | Kim | H03H 11/483 327/356 |
| 2014/0355157 A1* | 12/2014 | Huang | H02H 9/046 361/56 |

* cited by examiner

*Primary Examiner* — Sibin Chen
(74) *Attorney, Agent, or Firm* — Foley & Lardner LLP

(57) ABSTRACT

A super scale switched capacitor for an integrated circuit is disclosed. In one embodiment the super scale switched capacitor circuit includes a capacitor coupled between a first node and a second node. A circuit is also included that contains a first circuit and a second circuit. The first circuit is configured to output a first current, which is a multiple of current effectively flowing through the capacitor from the second node to the first node. The second circuit is configured to input a second current, which is a multiple of current effectively flowing through the capacitor from the first node to the second node.

3 Claims, 6 Drawing Sheets

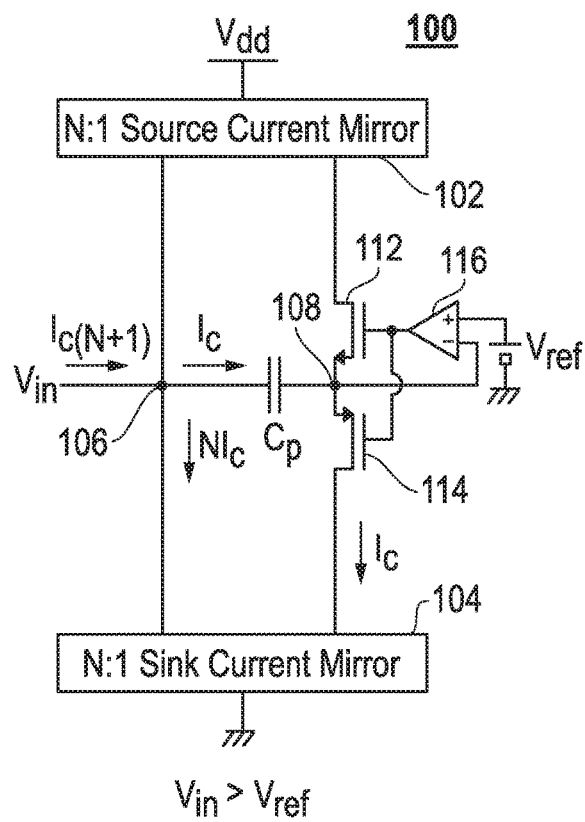
*FIG. 1A*          *FIG. 1B*
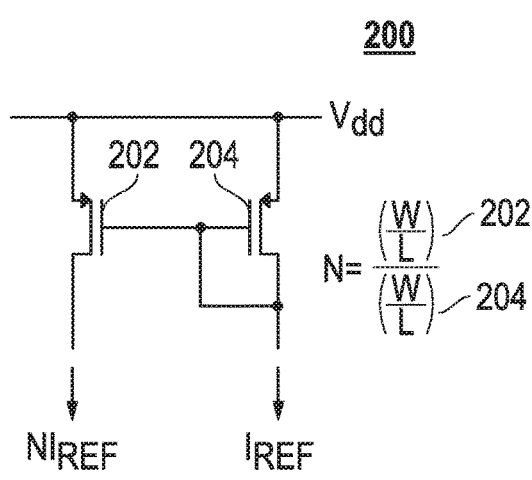   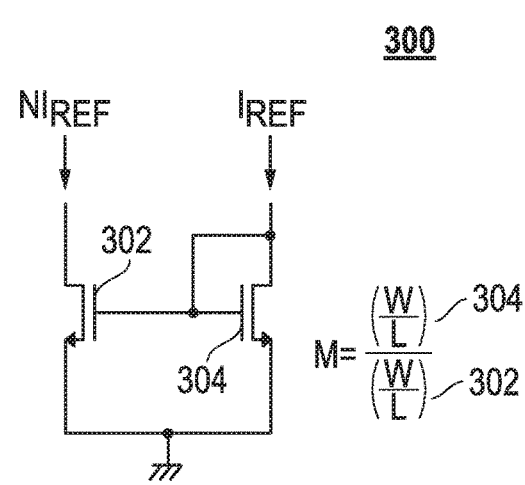
*FIG. 2*          *FIG. 3*

SUPER SCALE CAPACITOR FOR INTEGRATED CIRCUIT

CROSS-REFERENCE TO RELATED APPLICATIONS

The present application claims priority to U.S. Provisional Patent Appln. No. 62/510,558, filed May 24, 2017, the contents of which are incorporated herein by reference in their entirety.

BACKGROUND

A capacitor is a passive, two-terminal component that stores electrical energy in an electric field. The physical form and construction of capacitors vary widely. Most capacitors contain at least two electrical conductors, which are separated by a dielectric medium. The electrical conductors often take form in metal plates or surfaces. When a voltage is applied to the capacitor, an electric field develops across the dielectric, causing a net positive charge to collect on one plate (i.e., the positive plate) and net negative charge to collect on the other plate (i.e., the negative plate). The effect of a capacitor is known as capacitance. Capacitance can be defined as $C=Q/V$, or the ratio of the electric charge Q on each plate to the potential difference V between them.

Current through any component in a circuit is defined as the rate of flow of a charge Q passing through it. Actual charges—electrons—cannot pass through the dielectric of a capacitor. However, current can effectively pass through a capacitor when the voltage across it changes. With an increase in voltage, one electron accumulates on the negative plate for each one that leaves the positive plate, resulting in an electron depletion and consequent positive charge on one plate that is equal and opposite to the accumulated negative charge on the other. Thus, when the voltage across a capacitor increases, current effectively flows from the positive plate to the negative plate to balance out the increase in voltage. This current is often referred to as displacement charge current (hereinafter charge current). If the voltage is maintained for a sufficiently long time, the charge current ceases to flow between the plates. Likewise, when the voltage decreases, current effectively flows from the negative plate to the positive plate. This current will be referred to as displacement discharge current (hereinafter discharge current). If the reduced voltage is maintained for a sufficiently long time, the discharge current ceases to flow between the plates. If a time-varying voltage is applied across the capacitor, the current flow back and forth between the plates will be ongoing due to the charging and discharging cycles of the capacitor. The magnitude of the current needed to charge or discharge a capacitor is proportional to its capacitance. In other words, more current is needed to charge or discharge a capacitor with a higher capacitance during a given period of time.

Capacitance is proportional to the surface area of the plates; capacitor with greater surface areas have higher capacitance. Capacitors are employed in integrated circuits (ICs) or circuits formed on semiconductor dies with limited size. The capacitance or size (i.e., surface area) of a capacitor is a design consideration that must be considered given the limited size of semiconductors dies. Capacitors can be too large (i.e., capacitors with large capacitance) to be included in an IC on a semiconductor die since they occupy too much of the real estate thereof. When this happens, designers often resort to use of discrete capacitors. Unfortunately, discrete components increase the cost and complexity of the resulting system in which they are employed. On the other hand, performance variables often require capacitors to have a minimal size when employed in semiconductor dies. Ultimately IC capacitors are often limited to a size range (e.g., between 0.03 pF on the low end to 20 pF on the high end).

Capacitance multiplier circuits (hereinafter capacitance multipliers) or capacitance divider circuits (hereinafter capacitance dividers) can address the limitations on IC capacitors described above. A capacitance multiplier is a circuit that is designed to make a small capacitor function like a capacitor that is much larger. A capacitance divider is a circuit that is designed to make a large capacitor function like a capacitor that is much smaller.

SUMMARY

Capacitance multipliers and capacitance dividers can be broadly classified. The present embodiments will be described with reference to current-based multipliers and dividers, it being understood the present embodiments should not be limited thereto. In a current-based capacitance multiplier or divider, charge or discharge current is sensed, multiplied and fed back, the result of which is to raise or lower the effective capacitance of a capacitor.

A super scale switched capacitor for an integrated circuit is disclosed. In one embodiment the super scale switched capacitor includes a capacitor coupled between a first node and a second node. A circuit is also included that contains a first circuit and a second circuit. The first circuit is configured to output a first current, which is a multiple of current effectively flowing through the capacitor from the second node to the first node. The second circuit is configured to input a second current, which is a multiple of current effectively flowing through the capacitor from the first node to the second node.

BRIEF DESCRIPTION OF THE DRAWINGS

In order that the advantages of the present embodiments will be readily understood, a more particular description of the embodiments briefly summarized above will be rendered by reference to specific embodiments that are illustrated in the appended figures. Understanding that these figures depict only some embodiments and are not therefore to be considered to be limiting of its scope, the embodiments will be described and explained with additional specificity and detail through the use of the accompanying figures.

FIGS. 1A and 1B illustrate operational aspects of an example capacitance multiplier circuit.

FIG. 2 illustrates an example of a source current mirror.

FIG. 3 illustrates an example of a sink current mirror.

The use of the same reference symbols in different drawings indicates similar or identical items.

DETAILED DESCRIPTION

Figure 4A:
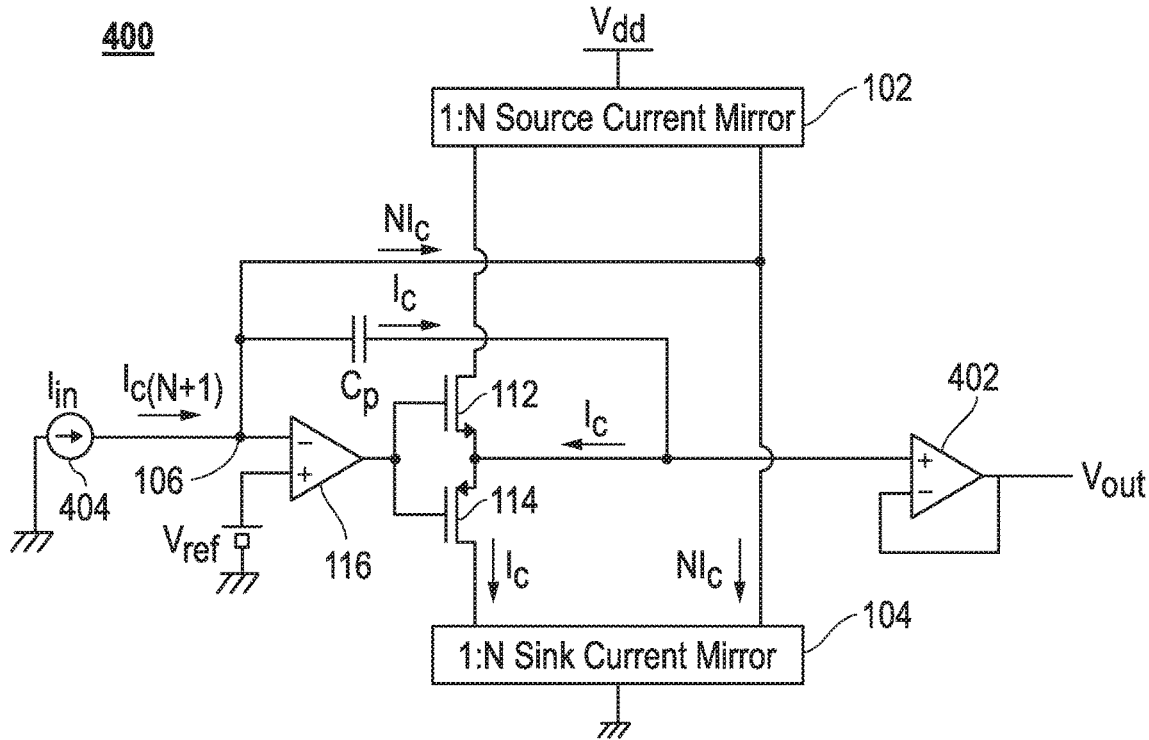
FIGS. 4A and 4B illustrate operational aspects of an integrator.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Capacitance Multiplier

A capacitance multiplier uses a relatively small capacitor to approximate a relatively larger capacitance value. FIGS. 1A and 1B illustrate an example capacitance multiplier circuit 100 according to one embodiment. FIG. 1A illustrates operational aspects of capacitance multiplier circuit 100 while capacitor Cp is being charged, and FIG. 1B illustrates operational aspects of capacitance multiplier circuit 100 while capacitor Cp is being discharged.

Capacitance multiplier circuit 100, which is a circuit formed on a semiconductor die, includes a current direction and detection circuit for selectively coupling capacitor Cp to either a first current duplication circuit 102 or a second current duplication circuit 104. In the embodiment shown, the current direction & detection circuit includes N-channel metal oxide semiconductor field effect (hereinafter NMOS) transistor 112, P-channel metal oxide semiconductor field effect (hereinafter PMOS) transistor 114 and operational amplifier 116. In one embodiment, transistors 112 and 114 may take form in enhancement mode devices. The current direction and detection circuit functions to selectively couple either circuit 102 or circuit 104, but not both at the same time, to node 108, when capacitor Cp is being charged or discharged as will be more fully described. The current direction and detection circuit should not be limited to that shown in the Figs. In an alternative embodiment, for example, NMOS transistor 112 and PMOS transistor 114 could be replaced with NPN bipolar and PNP bipolar transistors, respectively. In this alternative embodiment, the emitters of the bipolar transistors can be directly or indirectly coupled to node 108, and the transistors' bases can be coupled directly or indirectly to the output of operational amplifier 116. Other current direction and detection circuits are contemplated.

In FIG. 1A, capacitance multiplier circuit 100 receives current from an external device (not shown). A portion (i.e., Ic) of the current charges capacitor Cp. This charging current Ic flows through activated transistor 114 and is received by second current duplication circuit 104, which in turn draws a proportional current NIc via node 106 as shown in FIG. 1A. N is a value greater than zero. N can be less than, equal to, or greater than one. In FIG. 1B, capacitance multiplier circuit 100 outputs current to the external device. A portion (i.e., Ic) of the current discharges capacitor Cp. The discharge charging current Ic flows through activated transistor 112 from first current duplication circuit 102. First current duplication circuit 102 supplies a proportional current NIc to node 106 as shown.

First current duplication circuit 102 supplies a current NIc that depends on the discharge current Ic. Second current duplication circuit 102 draws a current NIc that depends on the charge current Ic. Circuits 102 and 104 may take any one of many forms. For purposes of explanation only, circuits 102 and 104 are presumed to take form in source and sink current mirrors, respectively. The present embodiments should not be limited thereto. Source and sink current mirrors are well-known in the art. In general a current mirror is a circuit that copies or "mirrors" a reference current in one active device by controlling a current in another active device. FIGS. 2 and 3 illustrate examples of source and sink current mirrors, respectively. The current mirrors shown in FIG. 2 or 3 are not necessarily, but could be used in the capacitance embodiments described herein. At the very least, the current mirrors shown in FIGS. 2 and 3 are provided to facilitate a general understanding of current mirror operation.

The source current mirror 200 shown within FIG. 2 includes PMOS transistors 202 and 204, which are coupled together and to supply voltage Vdd as shown. Source current mirror 200 replicates a source reference current Iref by scaling factor N to generate NIref. N can be defined by gate dimensions (i.e., width W and length L) of transistors 202 and 204 as shown. The sink current mirror 300 shown in FIG. 3 includes NMOS transistors 302 and 304, which are coupled together and to ground as shown. Sink current mirror 300 replicates the sink reference current Tref by scaling factor M. M can be defined by the gate dimensions (i.e., width W and length L) of transistors 302 and 304 as shown.

With continuing reference to FIGS. 1A and 1B, current mirrors 102 and 104 supply or receive charge or discharge current Ic (i.e., the reference current) via NMOS transistor 112 and PMOS transistor 114, which are controlled by operational amplifier 116. An operational amplifier is a DC-coupled high-gain electronic voltage amplifier with a differential input and, usually, a single-ended output. As shown in FIGS. 1A and 1B, high impedance non-inverting input (+) of operational amplifier 116 is coupled to a DC voltage (i.e., Vref), and high impedance inverting input (−) is directly coupled to node 108. In one embodiment Vref is Vdd/2. One of ordinary skill understands that operational amplifier 116 maintains node 108 at Vref.

Input voltage Vin is applied to capacitance multiplier circuit 100. Vin can vary in magnitude. When Vin exceeds Vref, operational amplifier 116 activates PMOS transistor 114 and deactivates NMOS transistor 112. When Vref exceeds Vin, operational amplifier 116 activates NMOS transistor 112 and deactivates PMOS transistor 114. As described above, current for charging capacitor Cp flows through PMOS transistor 114 when activated, and current for discharging capacitor Cp flows through NMOS transistor 112 when activated. Virtually no current flows into operational amplifier 116's inverting input (−) due to its high impedance. The combination of NMOS transistor 112, PMOS transistor 114, and operational amplifier 116, selectively coupled source and sink current mirrors 102 and 104, respectively, to node 108 based on Vin.

FIG. 1A illustrates operation of capacitance multiplier 100 when charging capacitor Cp. When Vin increases to a voltage greater than Vref, Ic, a portion of input current to capacitance multiplier 100, charges capacitor Cp. Sink current mirror 104 receives charge current Ic via activated PMOS transistor 114. As sink current mirror 104 receives charge current Ic, sink current mirror 104 draws a proportional current NIc via input node 106, where N is a scaling factor for sink current mirror 104. Kirchoff's law requires current flow into node 106 must equal current flow out of node 106. Accordingly, current input is Ic(N+1) when capacitor Cp is being charged. In other words, sink current mirror 104 increases the effective charging current by NIc, which has the substantially the same effect on the charge-up time as increasing the size of capacitor Cp.

FIG. 1B illustrates operation of capacitance multiplier 100 when discharging capacitor Cp. When Vin decreases to a voltage less than Vref, current Ic discharges capacitor Cp. This Ic is a portion of current output of capacitance multiplier 100. Source current mirror 102 supplies discharge current Ic to capacitor Cp via activated NMOS transistor 112. As source current mirror 102 supplies discharge current Ic, source current mirror 102 supplies a proportional current NIc to input node 106, where N is a scaling factor. In this embodiment, the scaling factors of current mirrors 102 and 104 should be substantially the same. Kirchoff's law requires current flow out of node 106 must equal current flow into node 106. Accordingly, current output from capacitance multiplier 100 is Ic(N+1) when capacitor Cp is being discharged. In other words, source current mirror 104 increases the effective discharge current by NIc, which has the substantially the same effect on the charge-down time as increasing the size of the capacitor Cp.

As a general rule, the magnitude of current needed to charge or discharge a capacitor to a voltage is proportional to the capacitor's capacitance. A capacitor with higher capacitance requires more current during the same period of time to charge or discharge when compared to a capacitor with lower capacitance. Multiplier circuit 100 requires current Ic(N+1) to effectively charge or discharge capacitor Cp to a voltage even though only a portion (i.e., Ic) is needed to actually charge or discharge capacitor Cp. As such multiplier circuit 100 operates to increase the capacitance of Cp by factor (N+1). For example, with N=19, capacitance multiplier 100 will realize an effective capacitance of 200 pF even though the actual capacitance of Cp is 10 pF.

Integrator Employing A Capacitance Multiplier

Figure 4B:
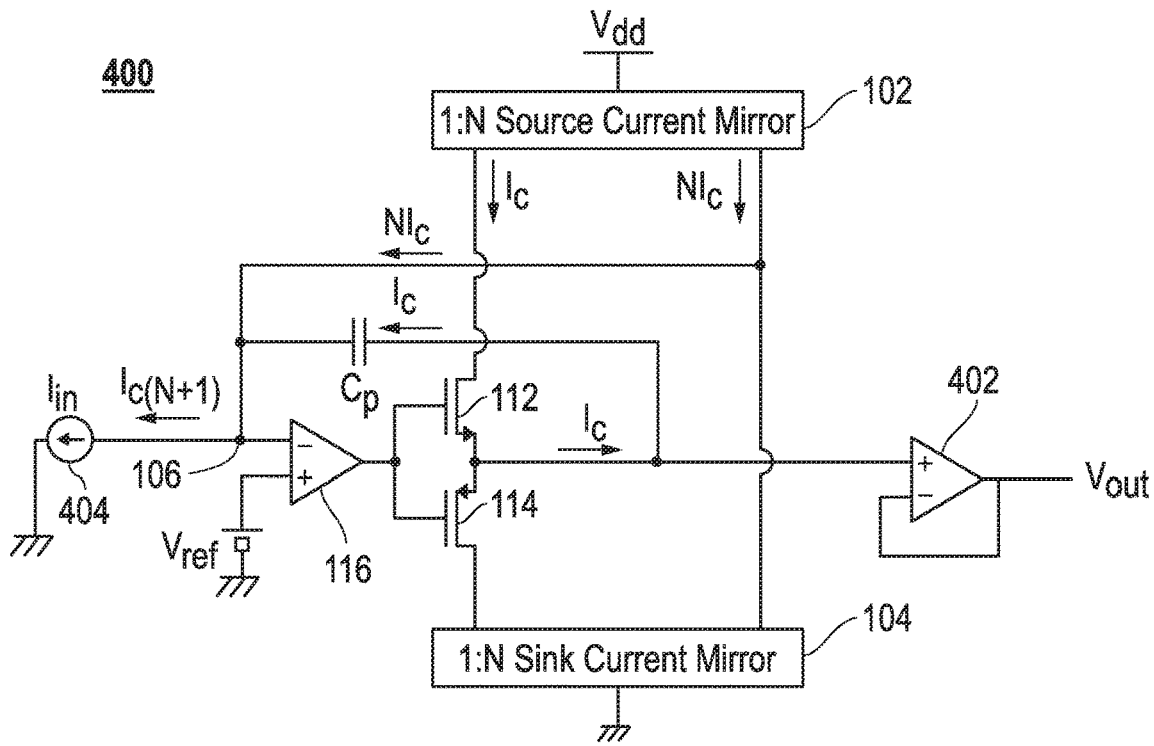

The capacitance multiplier effect described above can be employed in many ICs including integrators that are used in many analog systems such as filters and oversampled analog-to-digital convertors. Integrators are well known in the art and perform the mathematical operation of integration with respect to time. FIGS. 4A and 4B illustrate operational aspects of an integrator 400 that employs capacitance multiplication. Integrator 400 is used for integrating a variable input current Iin provided by a source 404. That is, output voltage Vout depends on the input current integrated over time. Integrator 400, which is formed on a semiconductor die, employs many of the components of capacitance multiplier circuit 100. Like capacitance multiplier 100, integrator 400 includes transistors 112 and 114, the gates of which are coupled to and controlled by the output of operational amplifier 116. Unlike the capacitance multiplier 100, the inverting input (−) of operational amplifier 116 of capacitance multiplier 402, is coupled to input node 106. Operational amplifier 116 maintains node 106 at Vref.

With the arrangement shown in FIGS. 4A and 4B operational amplifier 116 activates PMOS transistor 114 and deactivates NMOS transistor 112 when Iin flows into integrator 400 at node 106, and operational amplifier 116 activates NMOS transistor 112 and deactivates PMOS transistor 114 when Iin flows out of integrator 400 at node 106. Integrator 400 includes operational amplifier 402, which acts as a buffer to prevent a subsequent circuit (not shown) from unacceptably loading integrator 400 at its output. Virtually no current flows into operational amplifier 402's non-inverting input (−) due to its high impedance. The combination of NMOS transistor 112, PMOS transistor 114, and operational amplifier 116, selectively coupled source and sink current mirrors 102 and 104, respectively, to node 106. FIG. 4A illustrates operational aspects of integrator 400 when capacitor Cp is being charged, and FIG. 4B illustrates operational aspects of integrator 400 when capacitor Cp is being discharged.

With continuing reference to FIG. 4A, Ic charges capacitor Cp as Iin flows into integrator 400. Charging current Ic is a portion of input current In. The charging current Ic flows through activated PMOS transistor 114 to sink current mirror 104. While current Ic is charging capacitor Cp, sink current mirror 104 draws a proportional current NIc from Iin at node 106. Accordingly, current Ic(N+1) flowing into node 106 is needed when capacitor Cp is being charged. In other words, sink current mirror 104 increases the effective charging current by NIc, which has the substantially the same effect on the charge-up time as increasing the size of capacitor Cp. Conversely, with respect to FIG. 4B, current Ic discharges capacitor Cp when Iin flows out of node 106. The discharge current Ic flows through activated NMOS transistor 112 from current source mirror 102. While current Ic is discharging capacitor Cp, source current mirror 102 supplies a proportional current NIc to node 106. Accordingly, current Ic(N+1) flowing out of node 106 is needed when capacitor Cp is being discharged. In other words, source current mirror 102 increases the effective discharging current by NIc, which has substantially the same effect on the charge-down time as increasing the size of capacitor Cp.

Capacitance Divider

Figure 5A:
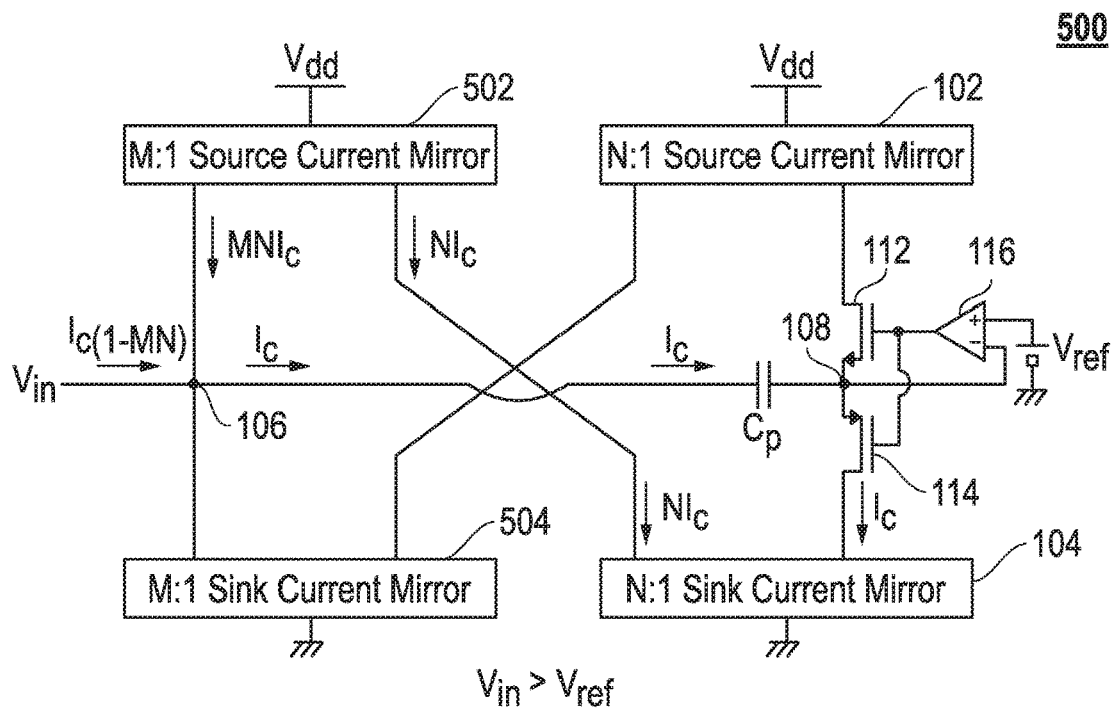
FIGS. 5A and 5B illustrate operational aspects of an example capacitance divider circuit.
Figure 5B:
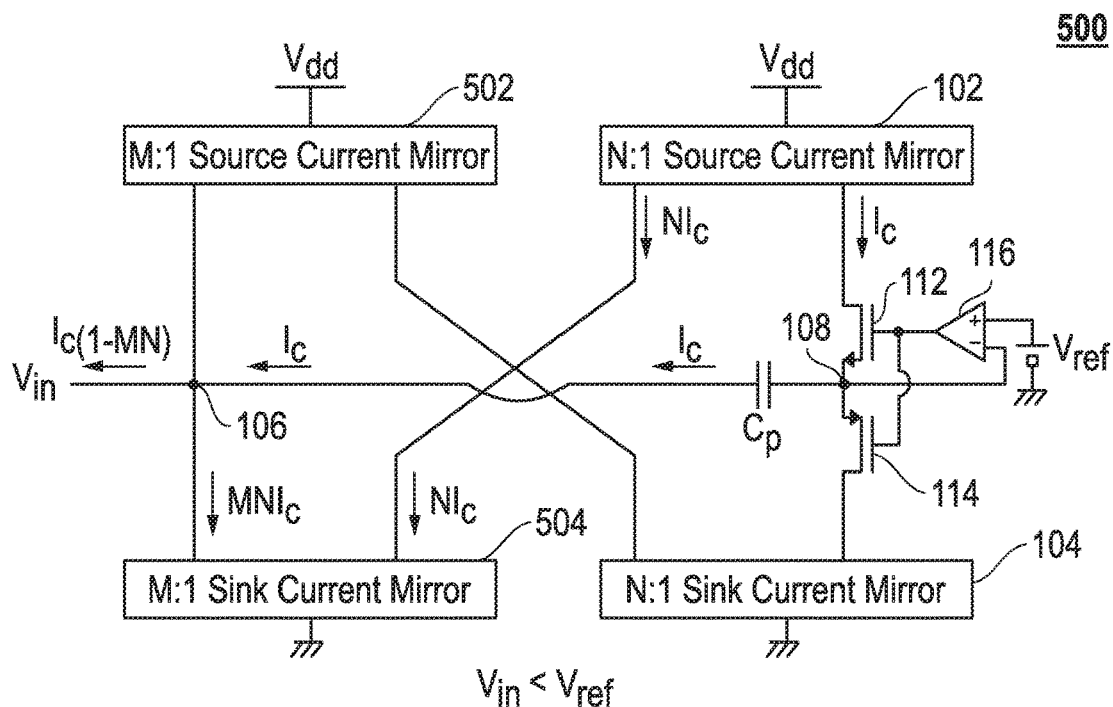

A capacitance divider circuit uses a large capacitor to approximate a smaller capacitor. FIGS. 5A and 5B illustrate an example capacitance divider circuit 500 formed on a semiconductor die. In the embodiment shown, capacitance divider circuit 500 employs many of the components of capacitance multiplier circuit 100. More particularly, capacitance divider circuit 500 includes source current mirror 102, sink current mirror 104, NMOS transistor 112, PMOS transistor 114, and operational amplifier 116. The source and sink current mirrors 102 and 104, however, are not coupled to the input node 106 as they are in the capacitance multiplier circuit 100. Rather, the source and sink current mirrors 102 and 104 are coupled to source current mirror 502 and sink current mirror 504, respectively, as shown. The multiplying factor N for current mirrors 102 and 104 of capacitance multiplier 100, can be substantially the same in capacitance divider circuit 500. Source current mirror 502 and sink current mirror 504 are designed with substantially the same multiplying factor M, which can be equal to or different (e.g., less) than N.

FIG. 5A illustrates operation aspects of capacitance divider 500 when charging capacitor Cp. With Vin greater than Vref, current Ic charges capacitor Cp. Sink current mirror 104 receives charge current Ic via activated PMOS transistor 114. As sink current mirror 104 receives charge current Ic, sink current mirror 104 draws a proportional current NIc from source current mirror 502. Source current mirror 502 has a scaling factor of M. As current mirror 104 draws NIc from current mirror 502, current mirror 502 supplies current MNIc to node 106. Thus, a current with magnitude Ic(1−MN) is needed by divider circuit 500 when capacitor Cp is being charged. In other words, the combination of sink current mirror 104 and source current mirror 502 operate to reduce the effective charging current by MNIc, which has substantially the same effect on the charge-up time as decreasing the size of the capacitor Cp. The effective capacitance is reduced by a factor of (1−MN).

FIG. 5B illustrates operation of capacitance divider 500 when discharging capacitor Cp. With Vref greater than Vin, current Ic flows as shown to discharge capacitor Cp. Source current mirror 102 supplies discharge current Ic to capacitor Cp via activated NMOS transistor 112. As source current mirror 102 transmits discharge current Ic, source current mirror 102 supplies a proportional current NIc to sink current mirror 504. Sink current mirror 504 has substantially the same scaling factor M as source current mirror 502. As sink current mirror 504 receives NIc from current mirror 102, sink current mirror 504 draws a proportional current MNIc at input node 106. Thus, a current with magnitude Ic(1−MN) is needed by divider circuit 500 when capacitor Cp is being discharged. In other words, the combination of source current mirror 102 and sink current mirror 504 operate to reduce the effective discharging current by MNIc, which has substantially the same effect on the charge-down time as decreasing the size of the capacitor Cp.

M and N can be selected so that MN<1. For example, current mirrors 102 and 104 can be designed with scaling factor N=1, and current mirrors 502 and 504 can be designed with scaling factor M=0.8 With these scaling factors, capacitance divider circuit 500 will realize an effective capacitance of, for example, 0.02 pF even though the actual capacitance of Cp is 0.1 pF. Importantly, capacitance divider circuit 500 can emulate a capacitor that is smaller than the lower limit of capacitors (e.g., 0.03 pF) that are often set by semiconductor manufacturers.

Integrator Employing a Capacitance Divider

Figure 6A:
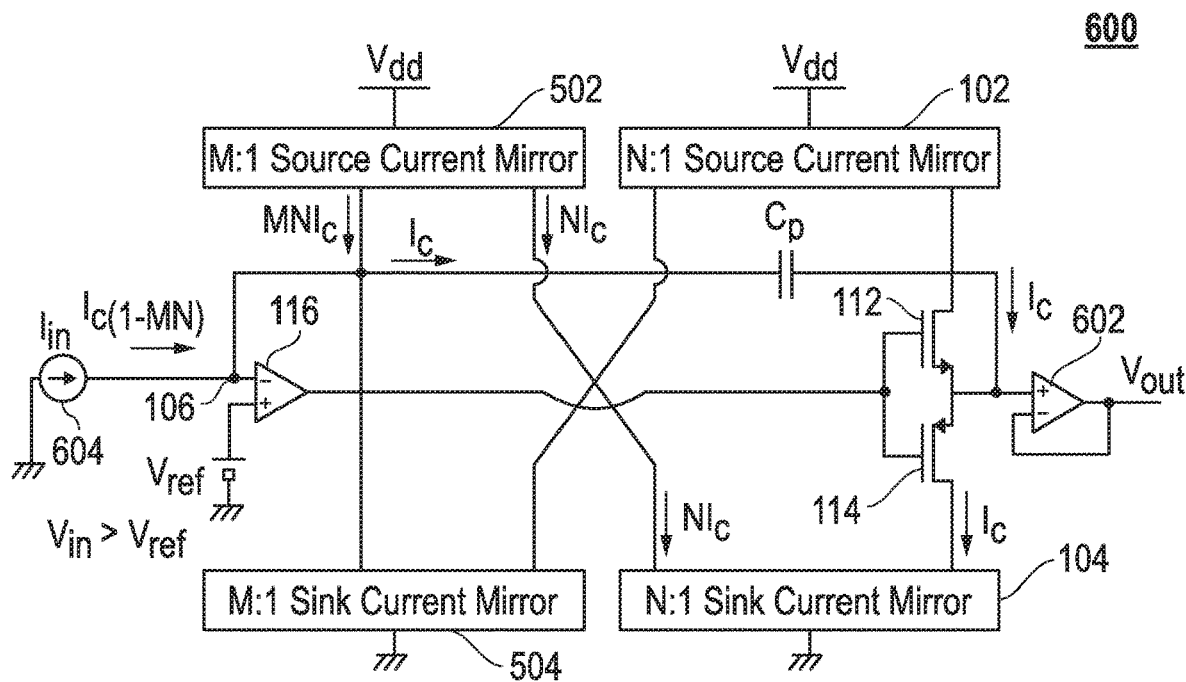
FIGS. 6A and 6B illustrate operational aspects of another integrator.
Figure 6B:
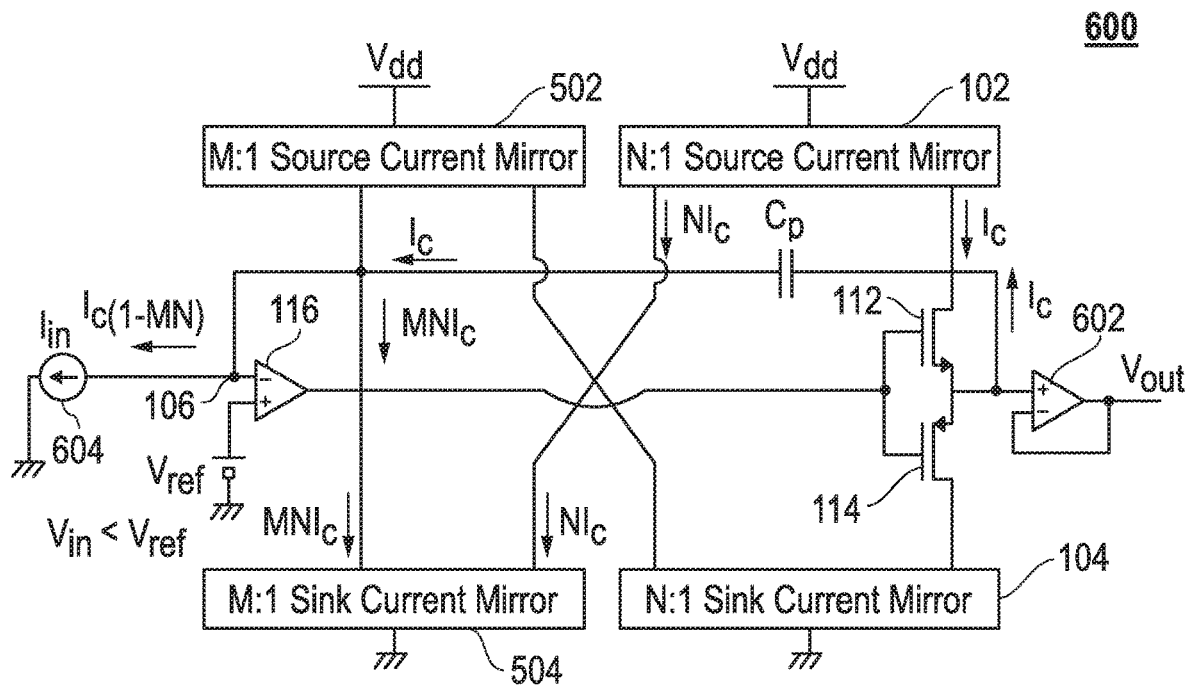

The capacitance divider effect described above can be employed in many ICs. FIGS. 6A and 6B illustrate an integrator 600 employing a capacitance divider. This integrator, which is formed as an IC on a semiconductor die, employs many of the components of capacitance divider 500. Like capacitance divider 500, the gates of transistors 112 and 114 in FIGS. 6A and 6B are coupled to and controlled by the output of operational amplifier 116. Unlike the capacitance divider 500, the inverting input (−) of operational amplifier 116 is coupled to input node 106. Operational amplifier 116 maintains node 106 at Vref.

With the arrangement shown in FIGS. 6A and 6B operational amplifier 116 activates PMOS transistor 114 and deactivates NMOS transistor 112 when Iin flows into node 106, and operational amplifier 116 activates NMOS transistor 112 and deactivates PMOS transistor 114 when Iin flows out of node 106. Operational amplifier 602 is also included and acts as a buffer to prevent a subsequent circuit (not shown) from unacceptably loading integrator 600 at its output. Virtually no current flows into operational amplifier 602's non-inverting input (−) due to its high impedance. FIG. 6A illustrates operational aspects of integrator 600 when capacitor Cp is being charged, and FIG. 6B illustrates operational aspects of integrator 600 when capacitor Cp is being discharged.

With continuing reference to FIG. 6A, the Ic portion of Iin charges capacitor Cp as Iin flows into node 106. The charging current Ic subsequently flows through activated PMOS transistor 114 to sink current mirror 104. While current Ic is charging capacitor Cp, sink current mirror 104 draws a proportional current NIc from source current mirror 502. As sink current mirror 104 draws NIc from source current mirror 502, current mirror 502 outputs a proportional current MNIc to input node 106. Accordingly, current Iin=Ic (1−MN) is needed to charge capacitor Cp. In other words, the combination of sink current mirror 104 and source current mirror 502 decreases the effective charging current by NMIc, which has the substantially the same effect on the charge-up time as decreasing the size of capacitor Cp.

Conversely, with respect to FIG. 6B, Ic discharges capacitor Cp as shown. The discharge current Ic is provided to capacitor Cp from current source mirror 102 through activated NMOS transistor 112. While current Ic is discharging capacitor Cp, source current mirror 102 outputs a proportional current NIc to sink current mirror 504. As current mirror 504 receives NIc from current mirror 102, current mirror 504 draws a proportional current MNIc at input node 106. Accordingly, current Iin=Ic(1−MN) is effectively needed to discharge capacitor Cp. In other words, the combination of source current mirror 102 and sink current mirror 504 decreases the effective charging current by NMIc, which has the substantially the same effect on the charge-down time as decreasing the size of capacitor Cp.

Switched-Capacitor Integrator Employing Capacitance Multiplier and Divider

Systems that use discrete components are more expensive and complex to make when compared to systems that use integrated components (i.e., components integrated on a semiconductor die). Switched-capacitor (SC) integrators are examples of systems that can benefit from the use of capacitance multipliers and/or dividers described herein instead of discrete capacitors.

SC integrators can be used in filters, which are devices that pass signals with frequencies in a certain range and reject (attenuates) signals with frequencies outside that range. Filters are employed, for example, in active protection systems of hard disk drive (HDD) controllers. Active protection systems attempt to avoid or reduce mechanical damage to HDDs when they experience sudden mechanical shocks. Active protection systems are often used in laptop computers that are frequently carried around and more prone to sudden impacts than desktop computers. During data read/write, the magnetic head of an HDD is very close (approximately 10 nm) from the magnetic disk. Active protection systems typically consists of shock sensors that alert the system when excess acceleration or vibration is detected. When the sock sensor detects sudden acceleration, the protection system tells the HDD controller to unload the head and prevent it from coming in contact with and scratching the disk.

Piezoelectric devices are typically used as shock sensors in HDD controllers. Piezoelectric devices generate very small (e.g., tens of mV) shock signals. A device is needed to detect, amplify and filter the shock signal. The filtering should have a very low cutoff frequency (e.g., several Hz) and a large passband (e.g., several tens of kHz). The device should have a high voltage gain without a DC offset since the device typically includes a comparator that detects an amplified shock signal by comparing it to a threshold. An integrator with low cutoff frequency can be used in the device to avoid DC output offset and provide a high gain pass-band. HDD controllers are often required to be small and lightweight. As a result of this requirement an onchip, capacitor based IC is preferred for detecting, amplifying and filtering the shock sensor signal.

Figure 7:
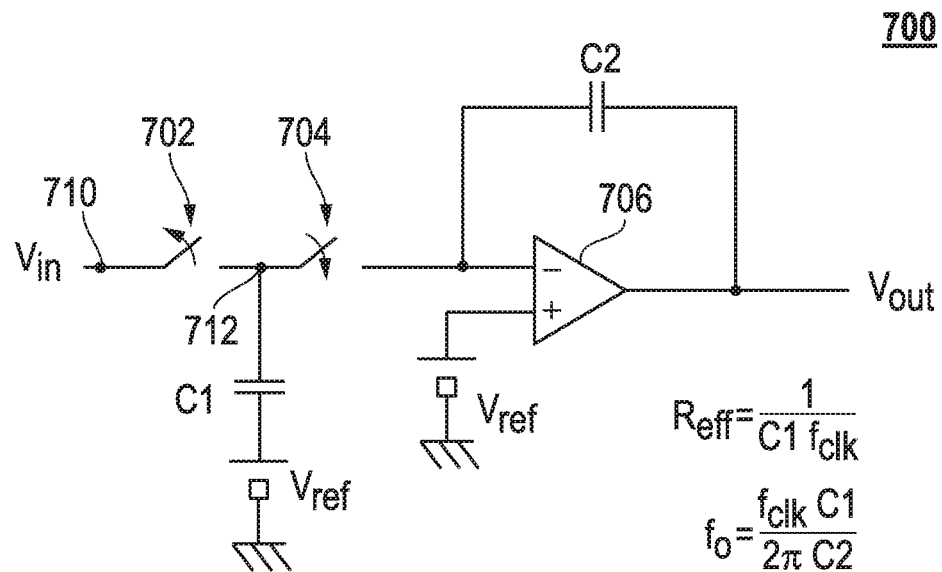
FIG. 7 illustrates an example of a switched capacitor integrator.

FIG. 7 illustrates an example of a switched capacitor (SC) integrator 700 that could be employed in an HDD controller. SC integrator 700 includes a switched-capacitor resistor (SCR) that includes capacitor C1, switch 702, and switch 704. SC integrator 700 also includes an integrator that includes capacitor C2 and operational amplifier 706.

SCRs emulate resistors and are well known in the art. Switches 702 and 704 are controlled by complementary, non-overlapping square waves having frequency fclk. One of ordinary sill in the art understands that the effective resistance of the SCR is Reff=1/(fclkC1) as measured between the input node 710 and the inverting input (−) of operational amplifier 706. In other words, the effective resistance Reff is inversely proportional to fclk and capacitor C1.

The lower cutoff frequency $f_0$ of SC integrator 700 can be defined as $f_0=(f_{clk}C1)/(2\pi C2)$. To avoid Nyquist problems, $f_{clk}$ should be large (e.g., $f_{clk}=250$ kHz). Integrators employed in HDD controllers as noted above, require a low cutoff frequency (e.g., $f_0=2.5$ Hz). To build SC integrator 700 with $f_0=2.5$ Hz and $f_{clk}=250$ kHz, C1 must be relatively small and/or C2 must be relatively large. However, as noted above, integrated capacitors are often limited in size to a range (e.g., 0.03 pF-20 pF). If C1 can be no smaller than 0.03 pF, than C2 must be 500 pF to achieve a lower cutoff frequency of $f_0=2.5$ Hz with $f_{clk}=250$ kHz. 500 pF is outside the range mentioned above. At the very least, a 500 pF capacitor may dominate the area of a semiconductor die upon which SC integrator 700 is formed. On the other hand, if C2 is limited to 20 pF, than C1 must be 0.0013 pF to achieve a lower cutoff frequency of $f_0=2.5$ Hz with $f_{clk}=250$ kHz. A capacitance value less than 0.03 pF, is outside the range mentioned above.

Figure 8:
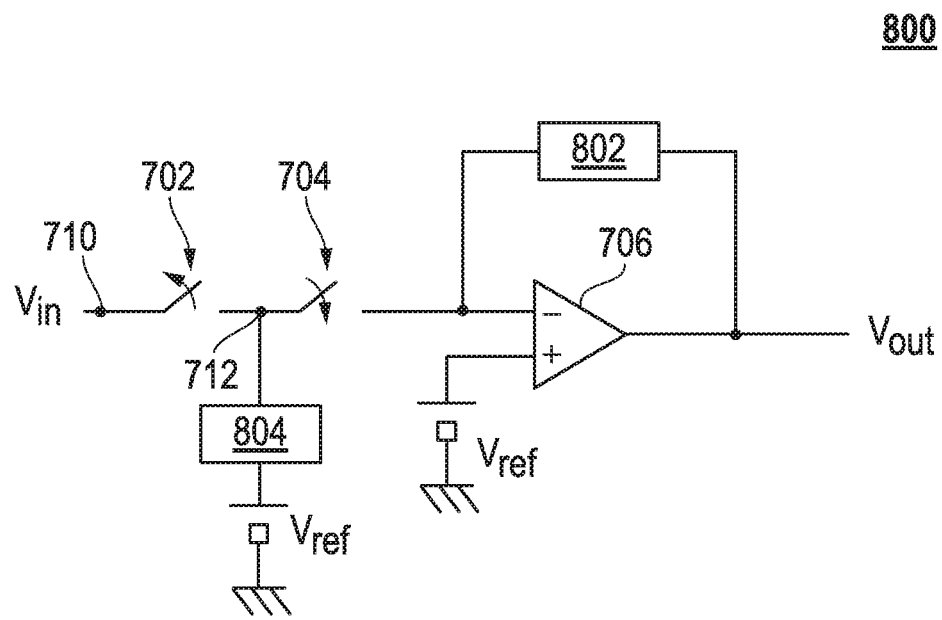
FIG. 8 illustrates an example of another switched capacitor integrator.

FIG. 8 illustrates an alternative SC integrator 800 that could be used in HDD controllers. SC integrator 800 is similar to SC integrator 700 shown in FIG. 7 with capacitors C1 and/or C2 replaced by capacitance multiplier circuit 802 and/or capacitance divider circuit 804, respectively. All components of SC integrator 800 are formed on a semiconductor die to avoid use of discrete components. Multiplier circuit 802 may take form in the multiplier circuit 100 described above. Divider circuit 804 may take form in the divider circuit 500 described above. SC integrator 800 can be configured to have a lower cutoff frequency of $f_0=2.5$ Hz with $f_{clk}=250$ kHz.

Alternative SC Integrator

Figure 9:
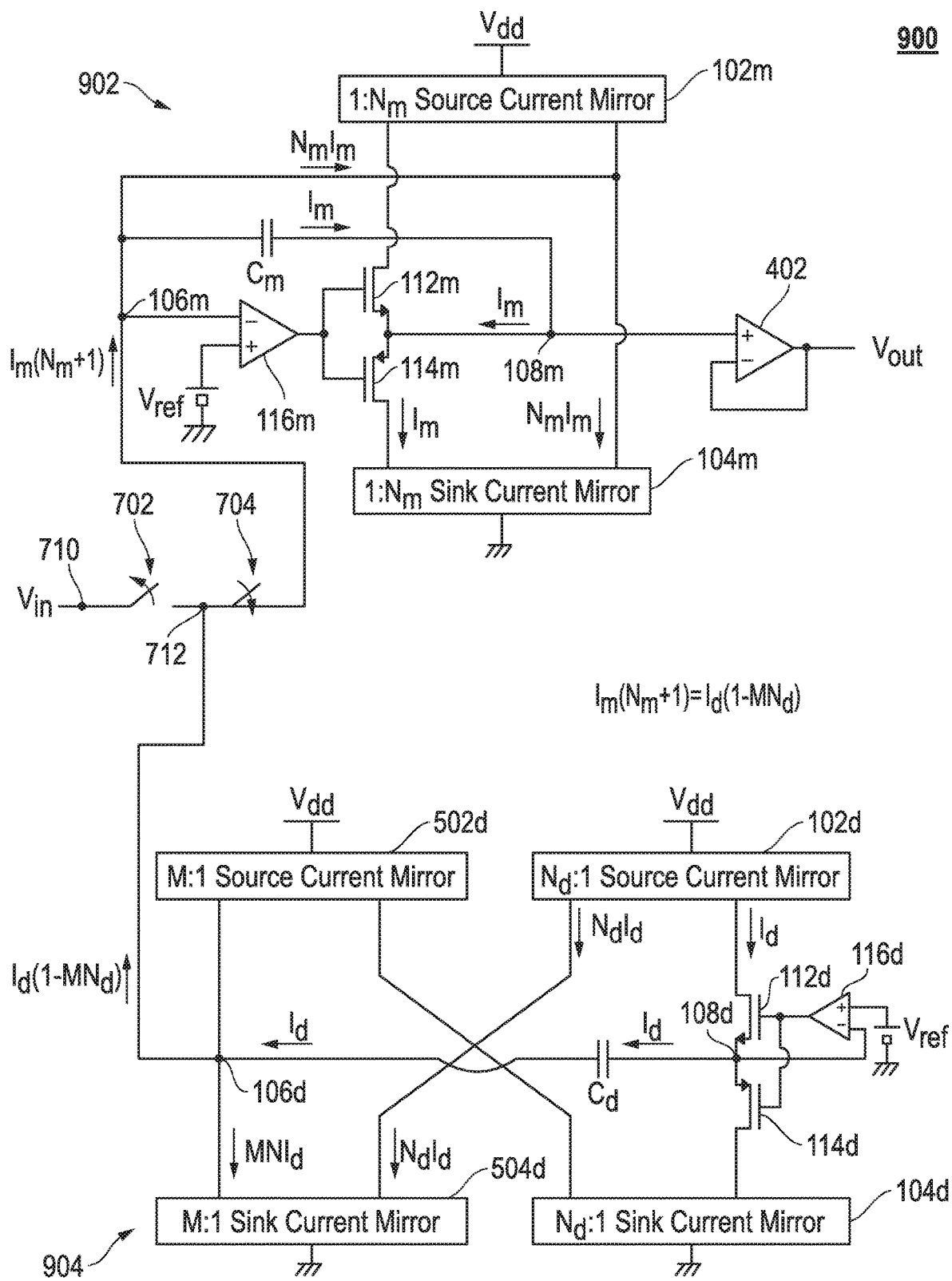
FIG. 9 illustrates operational aspects of one embodiment of the switched capacitor integrator shown in FIG. 8.

FIG. 9 shows an alternative design that includes integrator 902, which is similar to the integrator 400 of FIGS. 4A and 4B. SC integrator 900 also includes the SC of FIG. 7 with capacitor C1 replaced by a capacitance divider 904, which is similar to the capacitor divider 500 of FIGS. 5A and 5B.

FIG. 9 illustrates operation of SC integrator when integrator 902 integrates current provided by capacitor divider 904 via closed switch 704. In general current flows between capacitor divider 904 and integrator 902 until voltage equilibrium is reached therebetween. Before switch 704 is closed, switch 702 is closed to apply Vin to input node 106d of divider circuit 904. For purposes of explanation, it is presumed that Vin is greater than Vref when switch 702 is closed. As a result, current flows through switch 702, a portion of which is used to charge capacitor Cd. After switch 702 is opened and switch 704 closed, current is presumed to flow to integrator 902. When switch 704 is closed the output of operational amplifier 116m activates PMOS transistor 114m, and operational amplifier 116d activates NMOS transistor 112d. While capacitor Cd is discharging, sink current mirror 504d draws amplified current MNId from node 106d. Ultimately, divider circuit 904 transmits its output current Id(1−MNd) to integrator 902 via switch 704. Enabled PMOS transistor 114m transmits charging current Im to sink current mirror 104m. While capacitor Cm is charging, sink current mirror 104m draws current NmIm from node 106m. As a result of the forgoing, input current Im(Nm+1) to integrator 902, which is equal to the discharge current Id(1−MNd) from divider circuit 904, is needed to effectively charge capacitor Cm.

Importantly, scaling factors Nm, Nd, and M can be selected so that SC integrator 900 can be made with a low cutoff frequency of $f_0=2.5$ Hz and with switch 702 and 704 frequency of $f_{clk}=250$ kHz, while limiting the sizes of Cd and Cm to be within an acceptable range (e.g., between 0.03 pF and 20 pF). In other words, SC integrator 900 can be formed as an IC on a semiconductor die with cutoff frequency of $f_0=2.5$ Hz and with switch frequency of $f_{clk}=250$ kHz.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus comprising:
   a capacitor coupled between a first node and a second node;
   a circuit coupled to the first and second nodes, the circuit comprising:
      a first circuit configured to output a first current, which is a multiple of current effectively flowing through the capacitor from the second node to the first node;
      a second circuit configured to input a second current, which is a multiple of current effectively flowing through the capacitor from the first node to the second node;
      a p-channel metal-oxide semiconductor (PMOS) transistor connected in series with an n-channel metal-oxide semiconductor (NMOS) transistor, a combination of which is coupled between the first and second circuits, and wherein sources of the PMOS and NMOS transistors are coupled to the second node; and
      an operational amplifier (op-amp) comprising an inverting input, a non-inverting input, and an output, wherein gates of the PMOS and NMOS transistors are coupled to and controlled by the output, wherein the second node is coupled to the inverting node, wherein the non-inverting node is coupled to a reference voltage node, wherein the reference voltage node is configured for connection to a reference voltage Vref.

2. The apparatus of claim 1 wherein the first current exits the circuit via the first node, and wherein the second current enters the circuit via the first node.

3. An apparatus comprising:
   a capacitor coupled between a first node and a second node;
   a first current mirror configured to output a first current, which is a multiple of current effectively flowing through the capacitor from the second node to the first node;

a second current mirror configured to input a second current, which is a multiple of current effectively flowing through the capacitor from the first node to the second node;

a p-channel metal-oxide semiconductor (PMOS) transistor connected in series with an n-channel metal-oxide semiconductor (NMOS) transistor, a combination of which is coupled between the first and second current mirrors, and wherein sources of the PMOS and NMOS transistors are coupled to the second node; and an operational amplifier (op-amp) comprising an inverting input, a non-inverting input, and an output, wherein gates of the PMOS and NMOS transistors are coupled to and controlled by the output, wherein the second node is coupled to the inverting node, wherein the non-inverting node is coupled to a reference voltage node, wherein the reference voltage node is configured for connection to a reference voltage Vref.

\* \* \* \* \*